US010763870B1

(12) United States Patent
Haines et al.

(10) Patent No.: US 10,763,870 B1
(45) Date of Patent: Sep. 1, 2020

(54) DIGITAL FRACTIONAL CLOCK SYNTHESIZER WITH PERIOD MODULATION

(71) Applicant: XILINX, INC., San Jose, CA (US)

(72) Inventors: Julian Haines, Dublin (IE); Rhona Wade, Dublin (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/827,257

(22) Filed: Mar. 23, 2020

(51) Int. Cl.
*H03K 3/027* (2006.01)
*H03L 7/197* (2006.01)
*H03K 19/20* (2006.01)
*H03K 19/21* (2006.01)

(52) U.S. Cl.
CPC ........... *H03L 7/1974* (2013.01); *H03K 3/027* (2013.01); *H03K 19/20* (2013.01); *H03K 19/21* (2013.01)

(58) Field of Classification Search
None
See application file for complete search history.

(56) References Cited

U.S. PATENT DOCUMENTS

| | | | | |
|---|---|---|---|---|
| 7,288,998 B2* | 10/2007 | Thomsen | ................ | H03L 1/022 331/10 |
| 9,794,096 B2* | 10/2017 | Bogdan | ............... | H04L 27/2601 |
| 9,838,236 B2* | 12/2017 | Bogdan | ............... | H04L 27/2656 |
| 9,954,543 B1* | 4/2018 | Chan | ....................... | H03L 7/099 |
| 2006/0132202 A1* | 6/2006 | Meltzer | .................... | H03L 7/23 327/156 |
| 2006/0290392 A1* | 12/2006 | Kuo | ...................... | H03L 7/0995 327/156 |
| 2012/0044000 A1* | 2/2012 | Hsieh | .................... | H03L 7/1974 327/156 |
| 2017/0134031 A1* | 5/2017 | Ezell | ......................... | H03L 7/23 |
| 2017/0373825 A1* | 12/2017 | Wu | .................... | H03C 3/0933 |
| 2018/0254882 A1* | 9/2018 | Bogdan | ................... | H03L 7/22 |
| 2020/0106448 A1* | 4/2020 | Yu | ......................... | H03L 7/0991 |

\* cited by examiner

*Primary Examiner* — Lincoln D Donovan
*Assistant Examiner* — Khareem E Almo
(74) *Attorney, Agent, or Firm* — Patterson + Sheridan, LLP

(57) ABSTRACT

An example clock synthesizer, having a single-phase clock signal as input and generating an output clock, includes a phase decrementer configured to receive a fractional period value, configured to, responsive to the fractional period value, maintain a fractional count, and configured to accumulate residual phase from cycle-to-cycle of the output clock. A clock generator provides an integer-count-zero signal indicative of an integer portion of the fractional count reaching zero. A clock phase selector is configured to provide a signal having a fractional portion of the fractional count. A phase generator and combiner is coupled to an output of the clock generator, and an output of the clock phase selector, and is configured to provide the output clock.

20 Claims, 13 Drawing Sheets

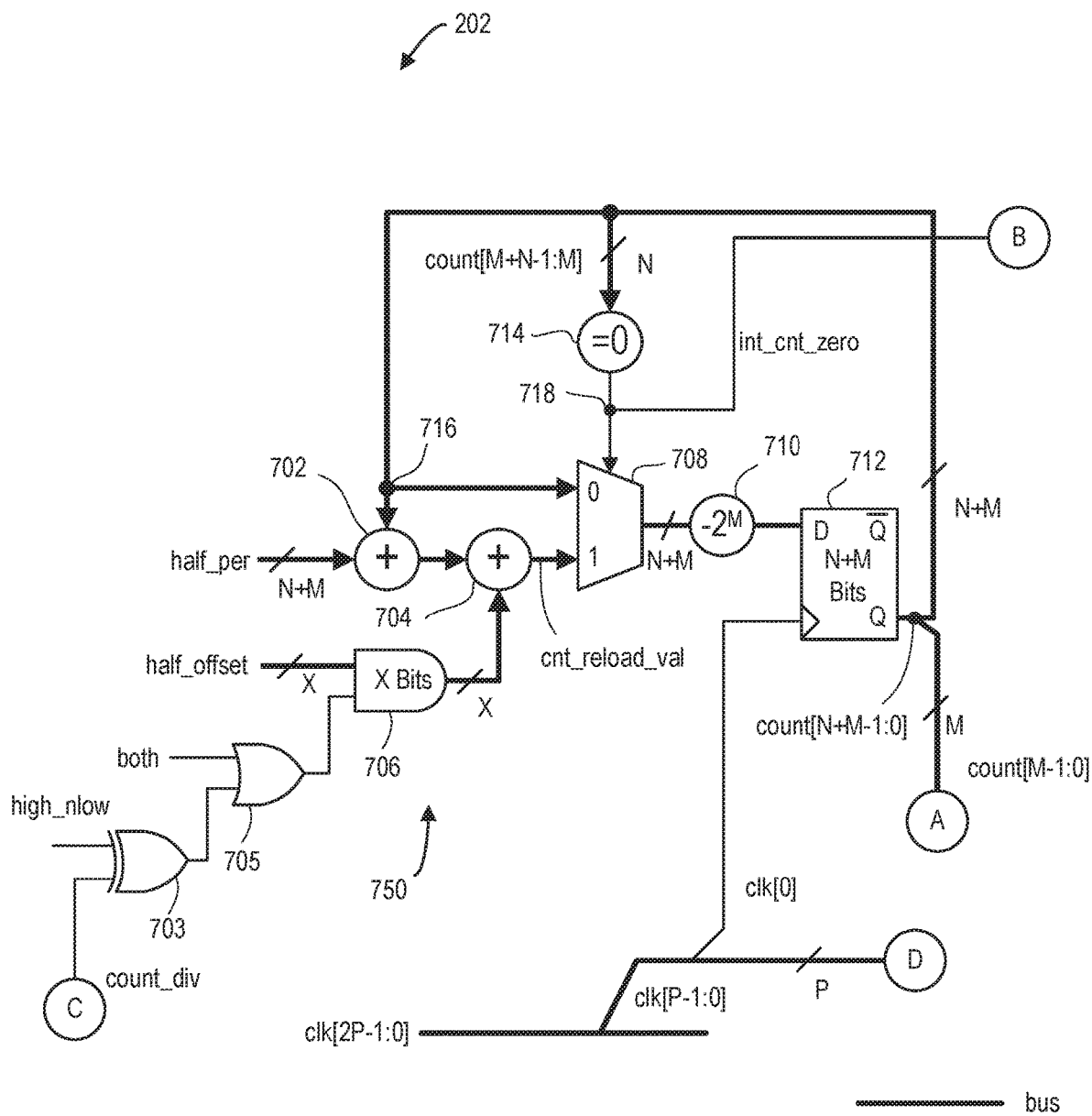
FIG. 7A
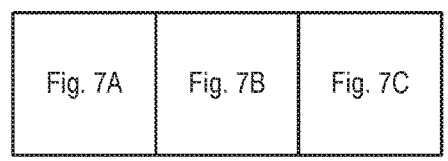

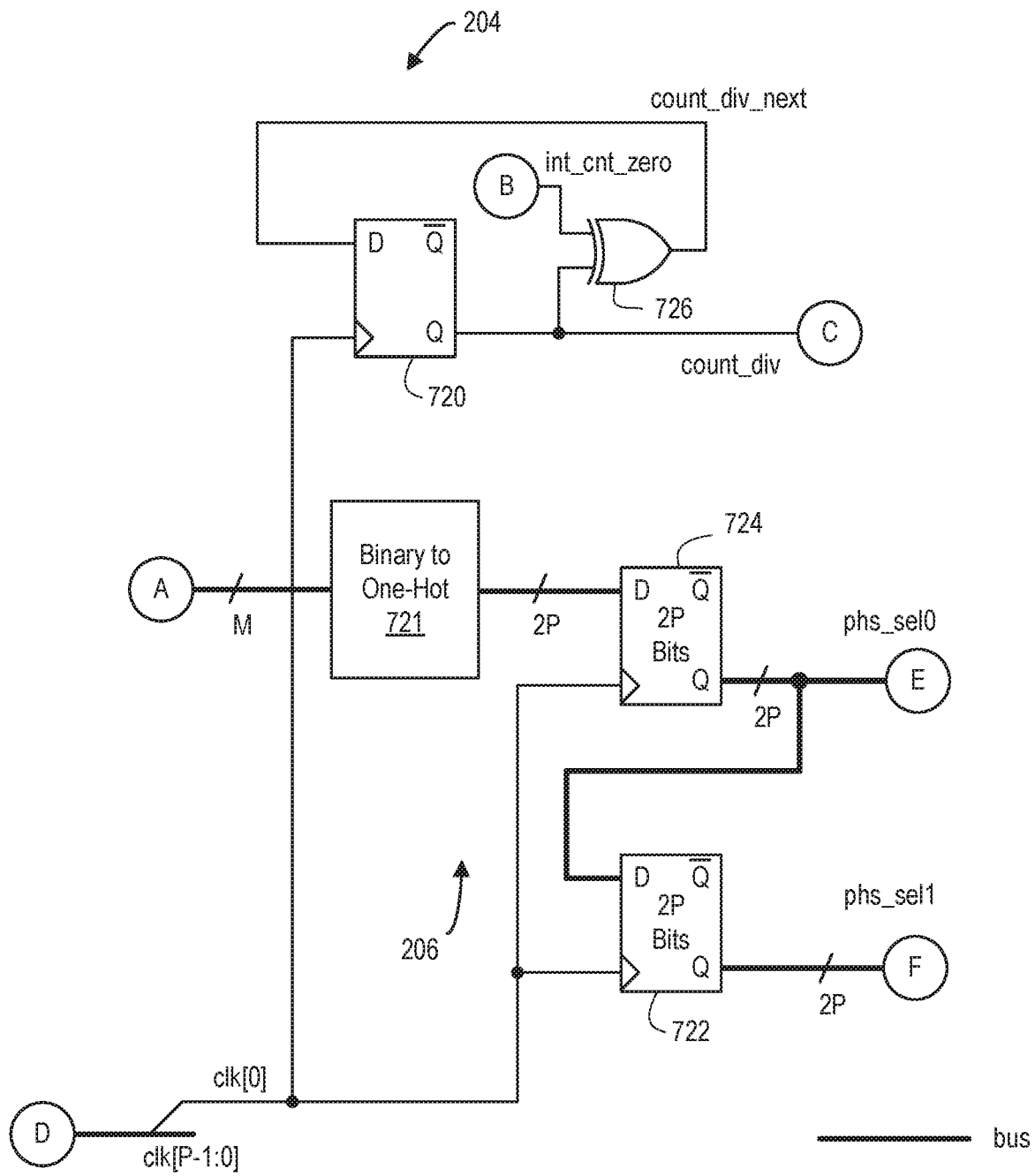
FIG. 7B
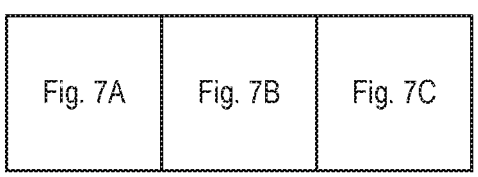

| Fig. 7A | Fig. 7B | Fig. 7C |

DIGITAL FRACTIONAL CLOCK SYNTHESIZER WITH PERIOD MODULATION

TECHNICAL FIELD

Examples of the present disclosure generally relate to electronic circuits and, in particular, to a digital fractional clock synthesizer with period modulation.

BACKGROUND

There are many well-known techniques to generate and modulate a clock or carrier waveform in various domains, often the analog domain. Existing analog techniques involve the use of an analog delay line used in open loop, but such a technique has the drawback of relatively poor timing stability. Existing digital techniques generally rely on integer division by a counter utilizing either rising or falling edges (but not both) of a single input clock. Greater timing resolution requires increased input clock frequency. It is desirable to provide a digital technique to generate and modulate a clock carrier waveform that achieves improved timing resolution without increasing the input clock frequency.

SUMMARY

Techniques for providing a digital fractional clock synthesizer with period modulation are described. In an example, a clock synthesizer having a single-phase clock signal as input and generating an output clock is described. The clock synthesizer includes: a phase decrementer having a first input and a second input, the second input configured to receive a fractional period value, the phase decrementer configured to, responsive to the fractional period value, maintain a fractional count and configured to accumulate residual phase from cycle-to-cycle of the output clock; a clock generator having an input coupled to a first output of the phase decrementer and an output coupled to the first input of the phase decrementer, the first output of the phase decrementer providing an integer-count-zero signal indicative of an integer portion of the fractional count reaching zero; a clock phase selector having an input coupled to a second output of the phase decrementer, the second output of the phase decrementer providing a signal having a fractional portion of the fractional count; and a phase generator and combiner coupled to an output of the clock generator, and an output of the clock phase selector, the phase generator and combiner configured to provide the output clock.

In another example, a clock synthesizer having a multi-phase clock signal as input and generating an output clock is described. The multi-phase clock signal including P clock phases, where P is an integer greater than one. The clock synthesizer includes: a phase decrementer having a first input and a second input, the second input configured to receive a fractional period value, the phase decrementer configured to, responsive to the fractional period value, maintain a fractional count and configured to accumulate residual phase from cycle-to-cycle of the output clock; a clock generator having an input coupled to a first output of the phase decrementer and an output coupled to the first input of the phase decrementer, the first output of the phase decrementer providing an integer-count-zero signal indicative of an integer portion of the fractional count reaching zero; a clock phase selector having an input coupled to a second output of the phase decrementer, the second output of the phase decrementer providing a signal having a fractional portion of the fractional count, the fractional portion of the fractional count having M bits, where $M=\log 2 (2*P)$; and a phase generator and combiner coupled to an output of the clock generator, and a pair of outputs of the clock phase selector, the phase generator and combiner configured to provide the output clock.

In another example, a circuit includes an analog circuit and a clock synthesizer, coupled to the analog circuit to provide an output clock. The clock synthesizer includes: a phase decrementer having a first input and a second input, the second input configured to receive a fractional period value, the phase decrementer configured to, responsive to the fractional period value, maintain a fractional count and configured to accumulate residual phase from cycle-to-cycle of the output clock; a clock generator having an input coupled to a first output of the phase decrementer and an output coupled to the first input of the phase decrementer, the first output of the phase decrementer providing an integer-count-zero signal indicative of an integer portion of the count reaching zero; a clock phase selector having an input coupled to a second output of the phase decrementer, the second output of the phase decrementer providing a signal having a fractional portion of the count; and a phase generator and combiner coupled to an output of the clock generator, and at least one output of the clock phase selector, the phase generator and combiner configured to provide the output clock.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIGS. 7A-7C show a block diagram depicting another example of the clock synthesizer of FIG. 2.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
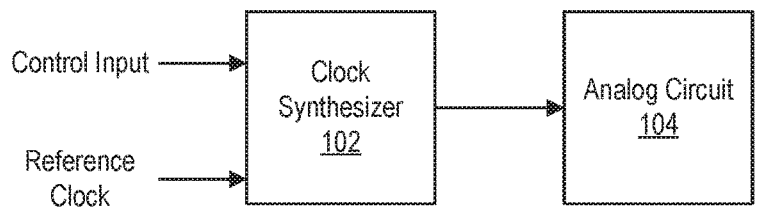
FIG. 1 is a block diagram depicting a clock synthesizer coupled to an analog circuit according to an example in which the techniques described herein can be used.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Techniques for providing a digital fractional clock synthesizer with period modulation are described. In examples, the techniques provide a digital method of synthesizing an output clock from both rising and falling edges of either a single-phase clock or a multi-phase clock to the resolution of the phase (or edge) spacing. The techniques provide the ability to modulate the period arbitrarily, for example at random or periodically, on a cycle-by-cycle basis. Fractional divide ratios from the input clock period are supported to the phase resolution of the input clock(s). The techniques use standard synchronous design techniques, which are therefore test and integration friendly. These and further aspects of the disclosed techniques can be understood with reference to the description of the drawings.

FIG. 1 is a block diagram depicting a clock synthesizer 102 coupled to an analog circuit 104 according to an example in which the techniques described herein can be used. The analog circuit 104 can be an analog-to-digital converter (ADC) or the like that utilizes a modulated clock signal. The clock synthesizer 102 includes a control input and a reference clock input. The clock synthesizer 102 employs a digital technique of synthesizing an output clock from both rising and falling edges of the reference clock. The reference clock can be either a single-phase or multi-phase input clock. Examples of the clock synthesizer 102 are described below. The analog circuit 104 uses the modulated clock output by the clock synthesizer 102 to perform its function (e.g., analog-to-digital conversion). Other types of analog circuits that can be used with the clock synthesizer 102 include any discrete time circuit, such as switched capacitor amplifiers, switched capacitor filters, and the like.

Figure 2:
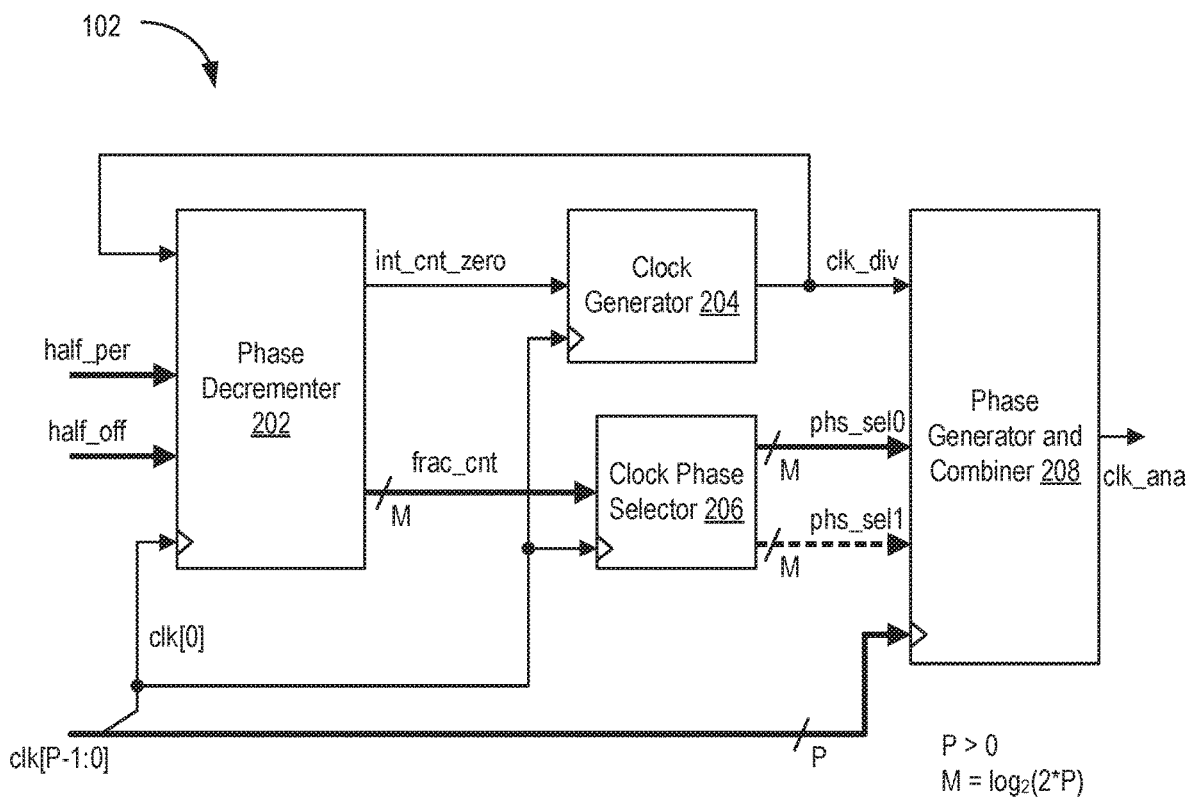
FIG. 2 is a block diagram depicting the clock synthesizer according to an example.

FIG. 2 is a block diagram depicting the clock synthesizer 102 according to an example. The clock synthesizer 102 includes a phase decrementer 202, a clock generator 204, a clock phase selector 206, and a phase generator and combiner 208. The circuits 202-208 comprise synchronous circuitry. Examples of the circuits 202-208 are described below.

The phase decrementer 202 includes a clock input configured to receive a single phase clock (clk[0]). In an example, clk[0] is a phase of a clock signal clk[P−1:0], where P is an integer greater than zero. In an example, P=1 and the clock synthesizer 102 operates using only a single-phase clock signal clk[0] (examples described below). In another example, P>1 such that the clock signal clk is a multi-phase clock signal. The phase decrementer 202 includes an input (half_per) and another input (half_off), which provide control signals. The signal half_per represents half of the output clock (clk_ana) period measured at the resolution of half input clock (clk) periods (referred to as a "fractional period value"). The signal half_off can be selectively added to modulate half_per and hence the output clock period. The phase decrementer 202 includes an input configured to receive a signal clk_div output by the clock generator 204 as feedback. The phase decrementer 202 includes an output (int_cnt_zero) and an output (frac_cnt). The output frac_cnt is an M-bit bus, where M=$\log_2(2*P)$. The phase decrementer 202 maintains a fractional count sequence representing half of the output clock (clk_ana) period of nominal length set by the input (half_per). The fractional count has an integer portion (e.g., N bits) and a fractional portion (e.g., M bits). The fractional count represents a remaining period of the output clock (clk_ana) period. That is, the phase decrementer 202 maintains a count that at any point in time represents the number of fractional clock cycles remaining in the current half-period of the output clock (clk_ana). Since the phase decrementer 202 operates on the rising edge of one clock phase only, the fractional portion of the fractional count value does not necessarily reach zero when the integer portion of the fractional count value has reached zero. As a result, the phase decrementer 202 accumulates the residual phase on the next half-cycle to avoid phase loss, which would result in short output clock cycles depending on phase alignment. The phase decrementer 202 is configured to accumulate residual phase from cycle-to-cycle of the output clock (clk_ana). The residual phase (near, but not equal to zero) is added to the nominal period (half_per) and a further offset, which can be random, is added to this nominal period to compute the duration of the next half period of the output clock (clk_ana).

The clock generator 204 includes an input coupled to receive int_cnt_zero from the phase decrementer 202. The int_cnt_zero signal is indicative of the integer portion of the count maintained by the phase decrementer 202 reaching zero. The clock generator 204 includes a clock input configured to receive clk[0]. The clock generator 204 includes an output that supplies clk_div. The signal clk_div is a clock signal that toggles each time int_cnt_zero is true, and thus the signal clk_div has a period of 2*half_per.

The clock phase selector 206 includes an input to receive the signal frac_cnt from the phase decrementer 202. The signal frac_cnt is the fractional portion of the count maintained by the phase decrementer 202. The clock phase selector 206 includes a clock input to receive the signal clk[0]. The clock phase selector 206 includes an output to provide a signal phs_sel0. In examples using a multi-phase clock signal (clk), i.e., P>1, the clock phase selector 206 includes another output to provide a signal phs_sel1. Each of phs_sel1 and phs_sel1 are M-bit busses.

The phase generator and combiner 208 includes an input to receive the signal clk_div, an input to receive the signal phs_sel0, an input to receive the signal phs_sel1, and a clock input to receive the clock signal clk[P−1:0]. The phase generator and combiner 208 includes an output to supply an output clock clk_ana (e.g., to be consumed by the analog circuit 104). The functions of the phase decrement 202, the clock generator 204, the clock phase selector 206, and the phase generator and combiner 208 are discussed below.

Figure 3:
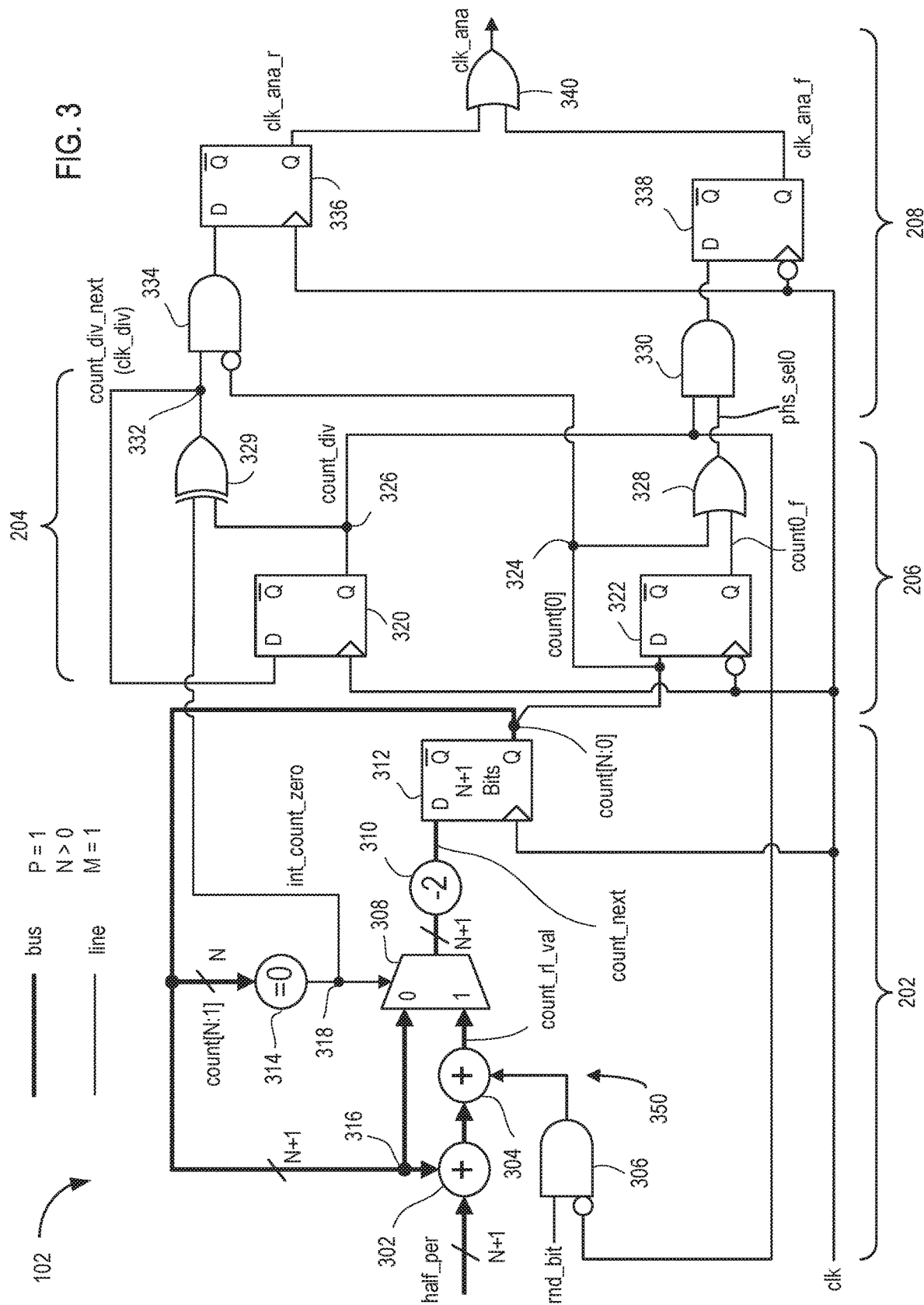
FIG. 3 is a block diagram depicting an example of the clock synthesizer of FIG. 2.

FIG. 3 is a block diagram depicting an example of the clock synthesizer 102 of FIG. 2. In this example, the clock signal (clk) has a single phase (e.g., P=1). For purposes of clarity, clk[0] is shortened to clk. In the example, the phase decrementer 202 comprises an adder 302, an adder 304, a multiplexer 308, a decrement-by-two circuit 310, a bank of flip-flops (referred to as register 312), a compare-to-zero circuit 314, and an AND gate 306. One input of the adder 302 is coupled to receive an (N+1)-bit signal half_per, and another input of the adder 302 is coupled to a node 316 of an (N+1)-bit bus, where N is an integer greater than zero. The signal half_per is half the nominal period of clk_ana measured in multiples of half periods of clk. The output clock (clk_ana) has a nominal period set by 2*half_per (the period of clk_div generated by the clock generator 204), but the actual period can be modulated from cycle-to-cycle by the input rnd_bit. As such, the signal half_per is N+1 bits, where the least significant bit (LSB) represents the $2^{-1}$ fractional place and the N most significant bits (MSBs) represent the integer portion.

An (N+1)-bit output of the adder 302 is coupled to an (N+1)-bit input of the adder 304. Another single-bit input of the adder 304 is coupled to an output of the AND gate 306. One input of the AND gate 306 is coupled to receive a signal rnd_bit, which is a single-bit implementation of half_offset. Another input of the AND gate 306 is coupled to a logical inverse of the node 326, which supplies a signal referred to as count_div. The adder 304 and the AND gate 306 provide a modulator 350 for the counter reload value half_per. The modulator 350 is gated by the signal count_div output by the clock generator 204.

The (N+1)-bit output of the adder 304 is coupled to a first input ("1") of the multiplexer 308, which is selected when count[N:1] is equal to zero. A second input ("0") of the multiplexer 308, which is selected when count[N:1] is non-zero, is coupled to the node 316. An (N+1)-bit output of the multiplexer 308 is coupled to an (N+1)-bit input of the decrement-by-two circuit 310. An (N+1)-bit output of the decrement-by-two circuit 310 is coupled to an input ("D") of the register 312. In the example, the decrement-by-two circuit 310 subtracts an integer two (binary 10) from the value output by the multiplexer 308. More generally, the output of the multiplexer 308 is decremented by the decimal value 1.0 regardless of the number of fractional bits (M) in the representation (e.g., binary 1 shifted left by M places). In the present example, M=1 and thus the circuit 310 decrements by binary 10 (binary 1 shifted left one place).

The register 312 comprises N+1 flip-flops each having a data input (D), an output (Q), an inverted output (Q_bar), and a clock input (where N is an integer greater than one). The clock input of each flip-flop in the register 312 is coupled to receive the signal clk. The outputs (Q) of the flip-flops in the register 312 provide the signal count[N:0] having a width of N+1 and are coupled to the node 316. The most significant bits (MSBs) count[N:1] output by the register 312 are coupled to the input of the compare-to-zero circuit 314 (i.e., the integer portion). An output of the compare-to-zero circuit 314 is coupled to a single-bit control input of the multiplexer 308. The compare-to-zero circuit 314 asserts logic "1" when the integer portion count[N:1] reaches zero, The signal count[0] is an implementation of frac_cnt shown in FIG. 2, where M=1 (since P=1). The register 312 stores the count of the phase decrementer 202.

The clock generator 204 includes a flip-flop 320 and an exclusive OR (XOR) gate 329. A clock port of the flip-flop 320 is coupled to receive the signal clk. A data port of the flip-flop 320 is coupled to a node 332. An output port (Q) of the flip-flop 320 is coupled to a node 326. The output port (Q) of the flip-flop 320 provides a signal count_div. One input port of the XOR gate 329 is coupled to the node 326, and another input port of the XOR gate 329 is coupled to the node 318. An output port of the XOR gate 329 is coupled to the node 332. The output port of the XOR gate 329 provides the signal count_div_next, which is the signal clk_div as shown in FIG. 2 (the output of the clock generator 204).

The clock phase selector 206 includes a flip-flop 322 and an OR gate 328. The flip-flop 322 is a falling-edge flip-flop. As used herein, a "falling-edge flip-flop" means the flip-flop loads values on falling edges of the applied clock signal, rather than rising edges of the applied clock signal. In the drawings, a falling-edge flip-flop is indicated by a bubble at the clock port. A data input of the flip-flop 322 is coupled to receive the signal count[0]. A clock input of the flip-flop 322 is coupled to receive the signal clk. An output (Q) of the flip-flop 322 is coupled to an input of the OR gate 328. Another input of the OR gate 328 is coupled to a node 324. An output of the OR gate 328 provides the signal phs_sel0. As noted above, in the single-phase implementation, the signal phs_sel1 is omitted.

The phase generator and combiner 208 includes an AND gate 334, an AND gate 330, a flip-flop 336, and a flip-flop 338. The flip-flop 338 is a falling-edge flip-flop. An input of the AND gate 334 is coupled to the node 332. Another input of the AND gate 334 is coupled to a logical inversion of the node 324. An input of the AND gate 330 is coupled to the node 326. Another input of the AND gate 330 is coupled to an output of the OR gate 328. An output of the AND gate 334 is coupled to a data input (D) of the flip-flop 336. A clock input of the flip-flop 336 is coupled to receive the clock signal clk. An output (Q) of the flip-flop 336 is coupled to an input of the OR gate 340. An output of the AND gate 330 is coupled to a data input (D) of the flip-flop 338. A clock input of the flip-flop 338 is coupled to receive the clock signal clk. An output (Q) of the flip-flop 338 is coupled to another input of the OR gate 340. The output of the OR gate 340 provides the signal clk_ana.

Referring to FIGS. 2-3, in operation, the phase decrementer 202 functions as a fractional down-counter (fractional count maintained in register 312) representing the time or remaining phase until the next output clock (clk_ana) edge, rising or falling, should be generated, measured in units of half the input clock (clk) period. Since the phase decrementer 202 operates wholly on the rising edge of the clock, the phase decrementer 202 ordinarily decrements by binary 10 on each clock cycle until an integer count of zero is reached. Upon reaching a count of zero, the phase decrementer 202 is reloaded with a value representing the duration of the next half output clock (clk_ana) period. Because the adjustment resolution is one half-clock period of clk, odd counter reload values decrement to a terminal count of one, which represents a residual phase of half a clock period at the final rising edge. The counter zero detection (compare-to-zero circuit 314) and reload therefore ignores the fractional bit zero indicating the clock phase, rising or falling, that should be used to generate the next output clock edge.

The nominal counter reload value is provided as a typically pseudo-static input, half_per, representing half of the output clock period measured in half input clock (clk) periods. To this any residual phase from the previous half output clock period is added (adder 302) and a further random bit (rnd_bit), 0 or 1, provides random modulation of the output clock (clk_ana) period (adder 304). In this implementation, the random bit is added only when computing the next output clock high period (AND gate 306 provides this gating logic).

Figure 9A:
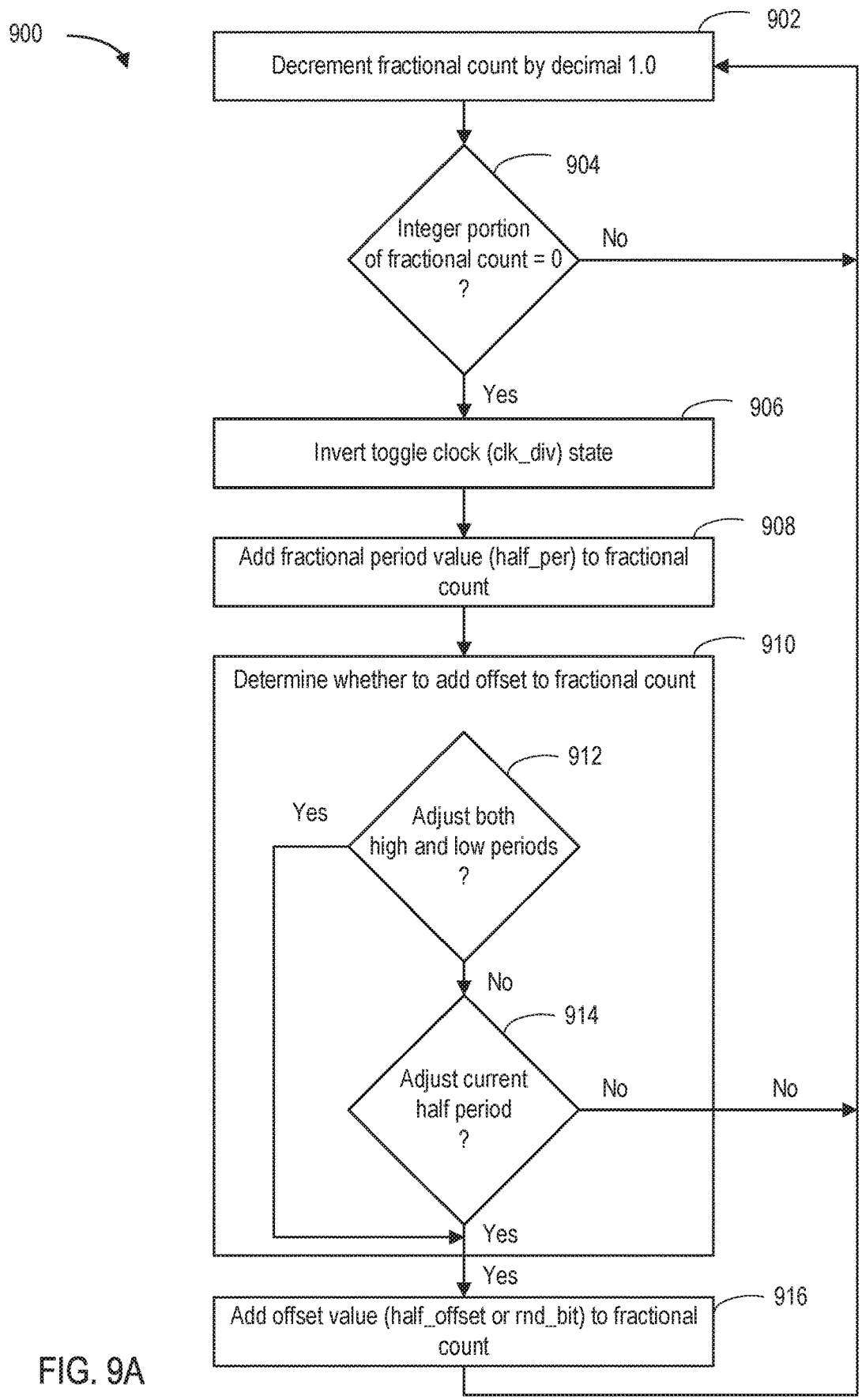
FIG. 9A is a flow diagram depicting a method of operation of a phase decrementer according to an example.

FIG. 9A is a flow diagram depicting a method 900 of operation of the phase decrementer 202 according to an example. The method 900 begins at step 902, where the phase decrementer 202 decrements the fractional count by decimal 1.0. At step 904, the phase decrementer 202 determines whether the integer portion of the fractional count is equal to zero. If not, the method 900 returns to step 902. If the integer portion of the fractional count is zero, the method 900 proceeds to step 906. At step 906, the phase decrementer 202 inverts the toggle clock (clk_div) state. At step 908, the phase decrementer 202 adds a fractional period value (half_per) to the fractional count. At step 910, the phase decrementer 202 determines whether to add an offset to the fractional count. If not, the method 900 returns to step 902 and continues decrementing the fractional count. If the phase decrementer 202 determines to add an offset to the fractional count, the method 900 proceeds to step 916. At step 916, the phase decrementer 202 adds an offset value to the fractional count (e.g., rnd_bit as shown in FIG. 3 or half_offset as shown in FIG. 7A).

In an example, as shown in FIG. 3, the phase decrementer 202 determines whether to add the offset based on the state of the count_div signal (e.g., a rising-edge delayed version of the toggle clock (clk_div)). If the count_div signal is true, the offset (rnd_bit) is not added. If the count_div signal is false, the offset (rnd_bit) is added. In another example, shown in FIG. 7, makes uses of a pair of control signals referred to as "both" and "high_nlow." In this example, at step 912, the phase decrementer 202 determines whether to adjust both high and low periods (i.e., based on whether the signal "both" is true). If the signal "both" is true, the method 900 proceeds from step 912 to step 916. If the signal "both" is false, the method 900 proceeds to step 914. At step 914, the phase decrementer 202 determines whether to adjust the current half period, high or low only (i.e., based on whether high_nlow !=count_div). If states of the signals high_nlow and count_div differ, then the method 900 proceeds from step 914 to step 916. If the states of the signals high_nlow and count_div are the same, then the method 900 proceeds from step 914 to step 902.

Returning to FIGS. 2-3, on each occasion the integer portion of the phase decrementer 202 reaches zero, the flip-flop 320 in combination with the following XOR gate 329 of the clock generator 204 is toggled. This provides clk_div, which is a rising-edge-aligned version of the output clock (clk_ana), but ignores the residual phase of count[0]. If there is no residual phase (count[0]==0), the output clock (clk_ana) edge should be aligned to the rising edge of the input clock (clk), so the state of the clock generator 204 (clk_div) is captured by the flip-flop 336 and passed to the output. However, if there is a residual phase (count[0]==1), the output clock (clk_ana) edge must be aligned to the falling edge of the input clock (clk). In this scenario, the rising-edge-delayed version (count_div) of the toggle clock (clk_div) is retimed to the falling edge of the input clock (clk) by the flip-flop 338 and passed to the output (clk_ana).

Figure 9B:
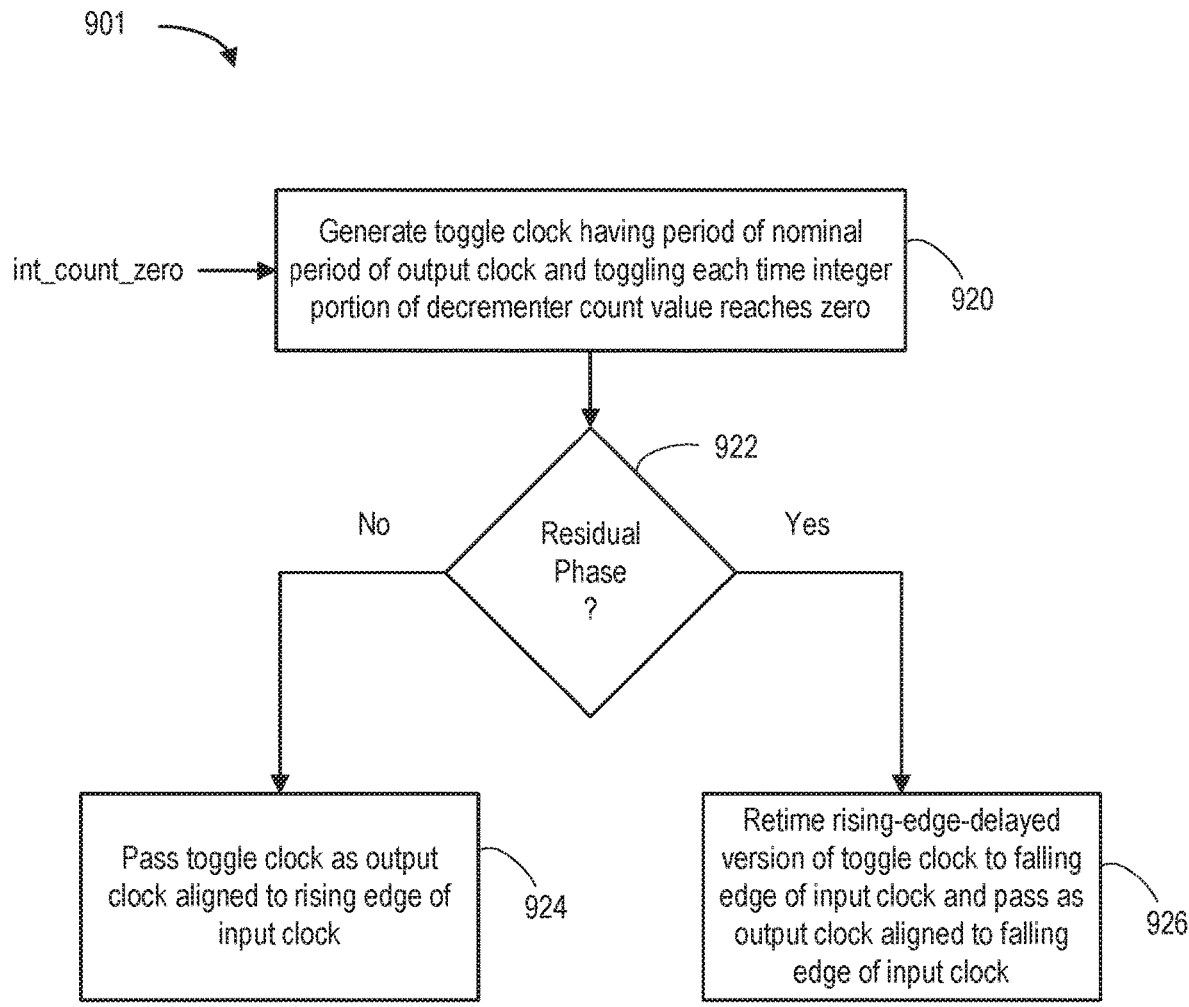
FIG. 9B is a flow diagram depicting a method of operation of a clock generator, a clock phase selector, and a phase generator and combiner according to an example.

FIG. 9B is a flow diagram depicting a method 901 of operation of the clock generator 204, the clock phase selector 206, and the phase generator and combiner 208 according to an example. The method 901 begins at step 920, where the clock generator 204 generates the toggle clock (clk_div) having a period of the nominal period of the output clock (clk_ana) and toggling each time the integer portion of the fractional count maintained by the phase decrementer 202 reaches zero (e.g., each time int_count_zero toggles). At step 922, the clock phase selector 206 determines whether there is a residual phase (count[0]==1). If not, the method 900 proceeds to step 924, where the phase generator and combiner 208 passes the toggle clock (clk_div) as the output clock (clk_ana) aligned to the rising edge of the input clock (clk). If there is a residual phase (count[0]==1), then the method 900 proceeds to step 926. At step 926, the clock phase selector 206 retimes the rising-edge-delayed version (count_div) of the toggle clock (clk_div) to the falling edge of the input clock (clk) (output as phs_sel0). The phase generator and combiner 208 passes phs_sel0 as the output clock (clk_ana) aligned to the falling edge of the input clock (clk).

Figure 8:
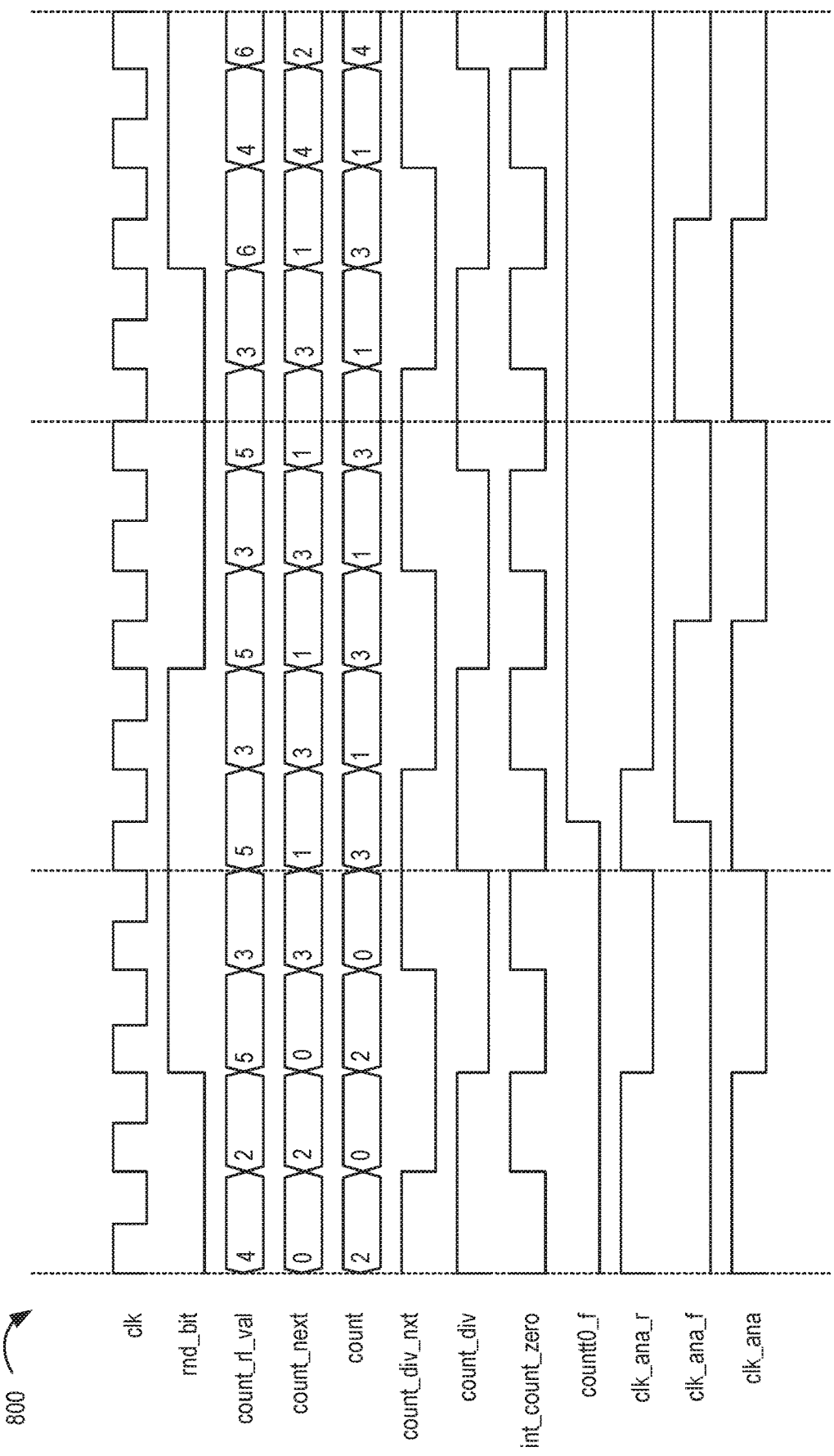
FIG. 8 is a signal diagram depicting signals in the clock synthesizer of FIG. 3 according to an example.

FIG. 8 shows a signal diagram 800 for signals of the clock synthesizer 102 shown in FIG. 3 according to an example. In the signal diagram 800, the horizontal axis represents time in arbitrary units. In the example, the output clock (clk_ana) has a first half-period of four half-periods of the input clock (clk). In response to rnd_bit=1, the output clock (clk_ana) next has a half-period of five half-periods of the input clock (clk). The output clock (clk_ana) next has a half-period of four half-periods of the input clock (clk).

Figure 4:
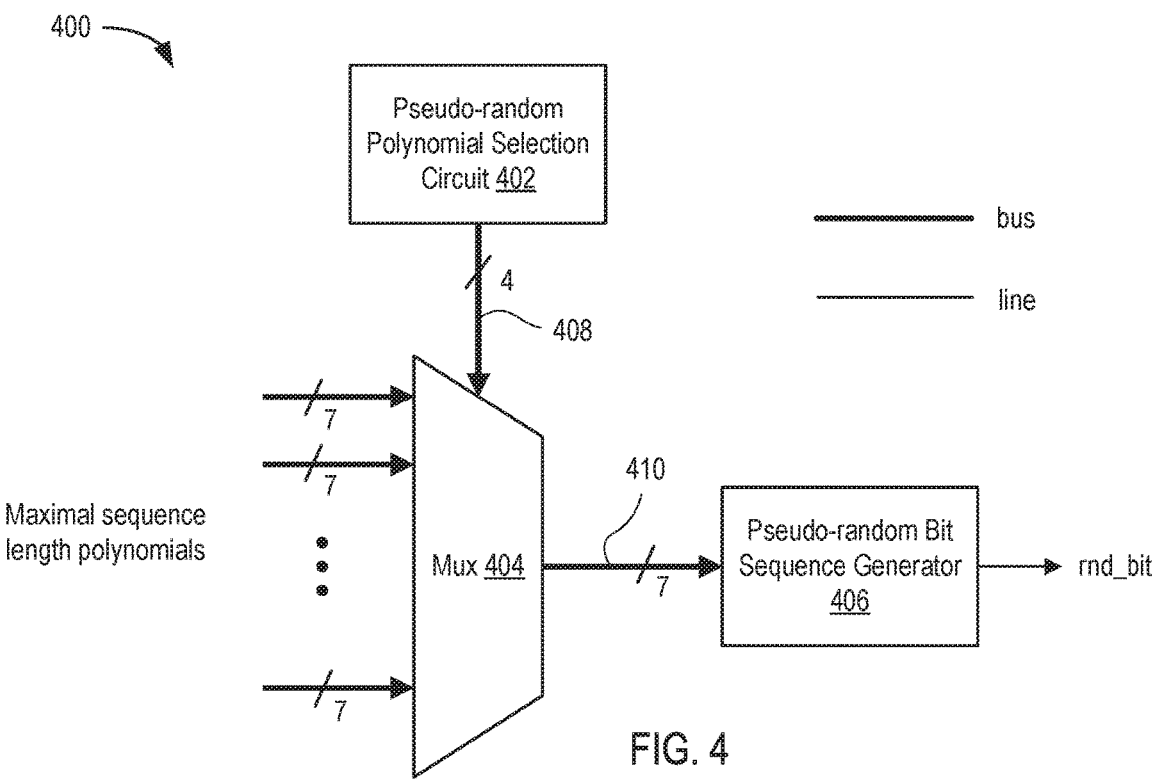
FIG. 4 is a block diagram depicting a randomizer according to an example to provide the random-bit described above.

FIG. 4 is a block diagram depicting a randomizer 400 according to an example to provide the random-bit signal (rnd_bit) described above in FIG. 3. The randomizer 400 includes a multiplexer 404, a pseudo-random polynomial selection circuit 402, and a pseudo-random bit sequence generator 406. Inputs of the multiplexer 404 receive a set of maximal sequence length polynomials. In the example, each polynomial is a 7-bit value. An output of the multiplexer 404 is coupled to an input of the pseudo-random bit sequence generator 406. An output of the pseudo-random bit sequence generator 406 provides a signal md_bit. A control input of the multiplexer 404 is coupled to an output 408 of the pseudo-random polynomial selection circuit 402. In the example, the output of the pseudo-random polynomial selection circuit 402 is a 4-bit output.

Figure 5:
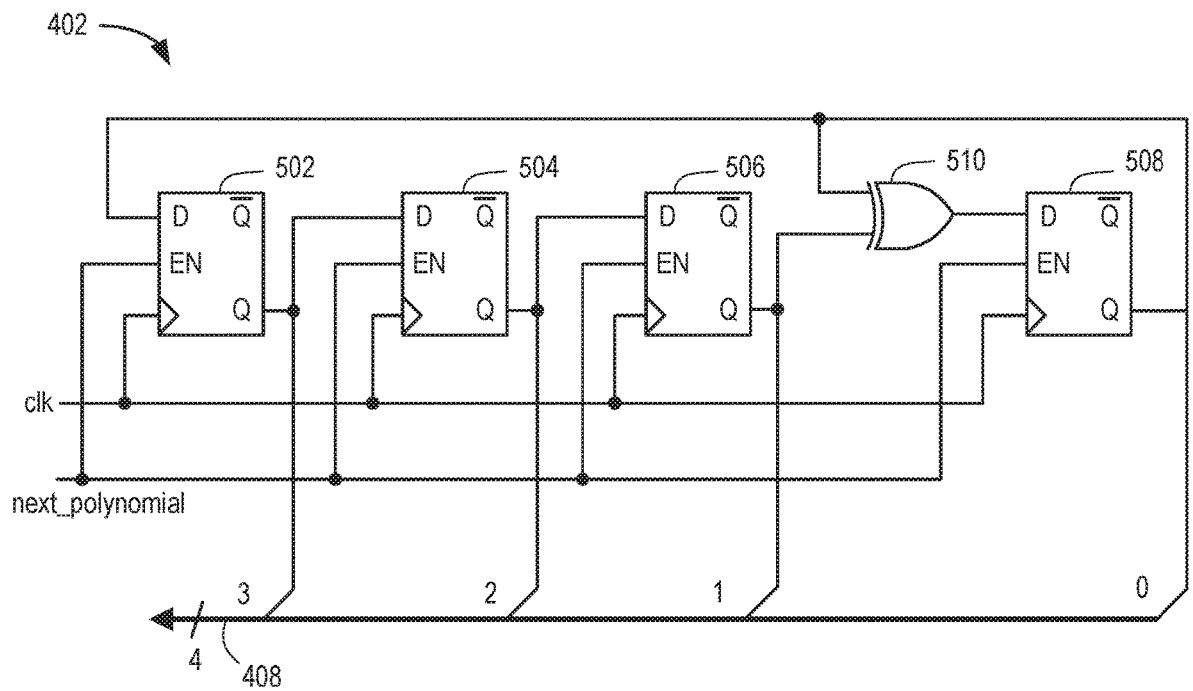
FIG. 5 is a block diagram depicting the pseudo-random polynomial selection circuit according to an example.

FIG. 5 is a block diagram depicting the pseudo-random polynomial selection circuit 402 according to an example. The pseudo-random polynomial selection circuit 402 includes flip-flops 502, 504, 506, and 508, as well as an exclusive OR gate 510. An input of the flip-flop 502 is coupled to an output (Q) of the flip-flop 508. An input of the flip-flop 504 is coupled to an output of the flip-flop 502. An input of the flip-flop 506 is coupled to an output of the flip-flop 504. An input of the exclusive OR gate 510 is coupled to an output of the flip-flop 508, and another input of the exclusive OR gate 510 is coupled to an output of the flip-flop 506. Clock inputs of the flip-flops 502, 504, 506, and 508 are coupled to receive the clock signal. An output of the exclusive OR gate 510 is coupled to an input of the flip-flop 508. A signal next_polynomial is coupled to enable inputs of each of the flip-flops 502, 504, 506, and 508. The collective output of the flip-flops 502, 504, 506, and 508 provides the output 408 (e.g., a 4-bit output). The signal next_polynomial controls whether the output 408 of the pseudo-random polynomial selection circuit 402 changes to select a next polynomial.

Figure 6:
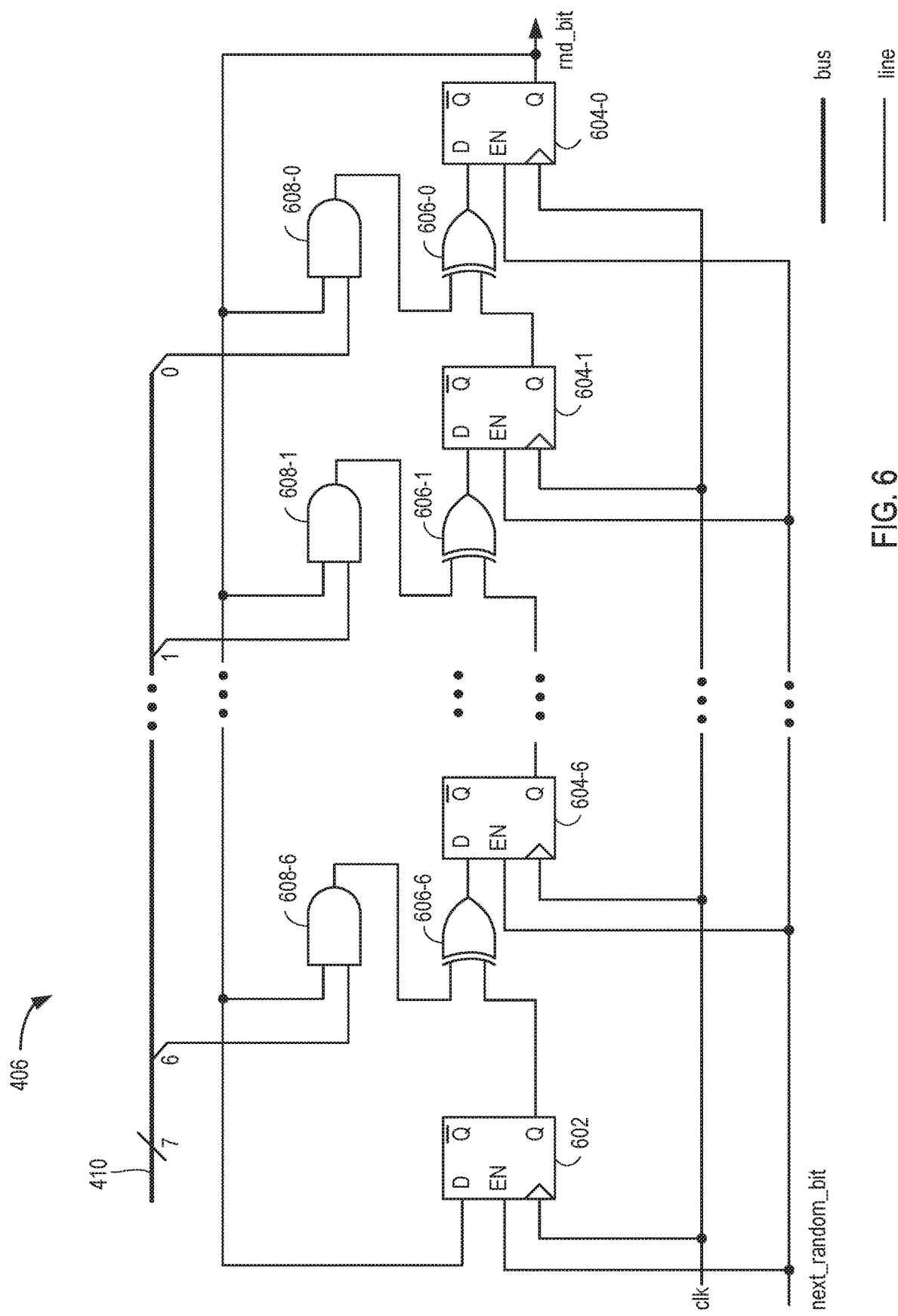
FIG. 6 is a block diagram depicting the pseudo-random bit sequence generator according to an example.

FIG. 6 is a block diagram depicting the pseudo-random bit sequence generator 406 according to an example. The pseudo-random bit sequence generator 406 includes flip-flop 602, flip-flops 604-0 through 604-6 (collectively flip-flops 604), as well as exclusive OR gates 606-0 through 606-6 (collectively XOR gates 606), and gates 608-0 through 608-6 (collectively AND gates 608). The clock inputs of the flip-flop 602 and the flip-flops 604 are coupled to receive the clock signal clk. An input of the flip-flop 602 is coupled to the output of the flip-flop 604-0 (rnd_bit). An output of the flip-flop 602 is coupled to one input of the exclusive OR gate 606-6. Another input of the exclusive OR gate 606-6 is coupled to an output of the AND gate 608-6. An input of the AND gate 608-6 is coupled to the rnd_bit output, and one line of the bus 410. This configuration proceeds similarly for each of the flip-flops 604-5 through 604-0, exclusive OR gates 606-5 through 606-0, and gates 608-5 through 608-0. Enable inputs of the flip-flop 602 and the flip-flops 604 receive the next_random_bit signal. The next_random_bit signal controls whether the pseudo-random bit sequence generator 406 outputs a new value for rnd_bit.

Referring to FIGS. 4-6, the randomizer comprises a 7-bit linear feedback shift register with a generator polynomial that is selected from a plurality of options (e.g., 15 options). Each option is chosen to provide a maximal length pseudo-random bit sequence of a specific number of steps (e.g., 127 steps). The generator polynomial is selected by a further 4-bit linear feedback shift, itself with a fixed maximal length sequence of a plurality of steps (e.g., 15 steps). Thus, each polynomial is selected in random sequence.

In the case the analog circuit consuming the clock is an ADC, the sequence length of the rnd_bit LFSR is chosen to be one less than the conversion period of the ADC. Maximal length LFSRs have a sequence length of $2^{n-1}$. In practice, this means the first, or last, clock cycle of a typical $2^n$ conversion cycle will not be randomized and should be arranged to be zero to balance the probability of random one's and zero's each at 50%. Because of the characteristics of maximal length sequences, the conversion period remains of fixed duration regardless of the randomization sequence and selected generator polynomial. This provides system advantages of known conversion time and sample rate versus alternative randomization schemes. For example, a longer sequence would introduce variability of conversion period depending on start phase while a shorter sequence would reduce the degree of randomization.

The inter-bit exclusive OR implementation of the LFSR (versus XORing the outputs) reduces correlation between adjacent bits without need for multiple shifts per read of rnd_bit. The next random polynomial (next_polynomial) is selected between successive ADC conversions (assuming an ADC being driving by the clock). This reduces the correlation between adjacent conversion results, which allows more effective noise cancelation during ADC calibration cycles and ultimately greater conversion result accuracy.

Figure 7C:
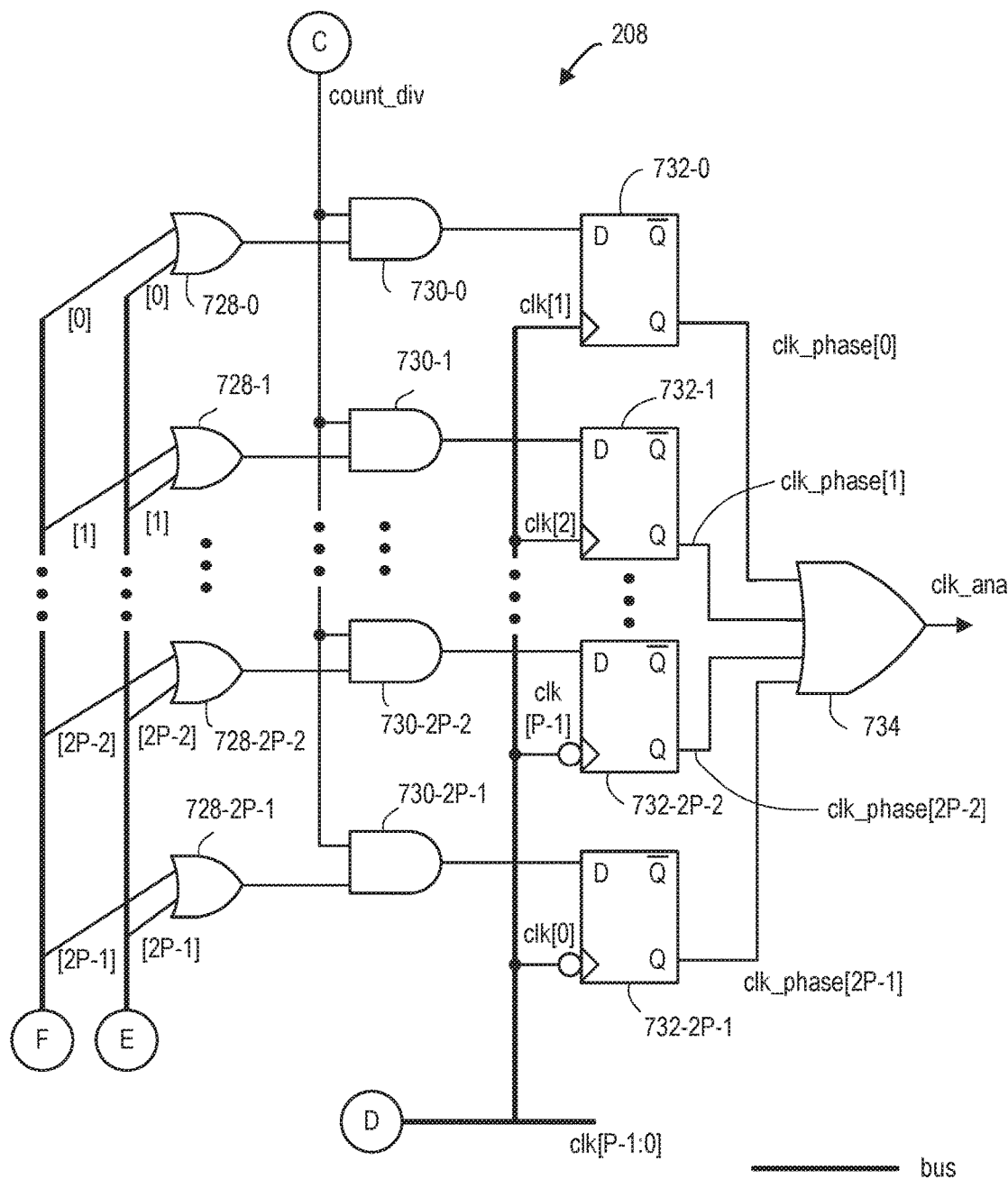

FIGS. 7A-7C show a block diagram depicting another example of the clock synthesizer 102 of FIG. 2. In this example, the clock signal is a multi-phase clock signal having 2*P clock phases, where P is an integer greater than one. In an example, only P phases of the 2*P phase input clock (clk) are coupled to the clock synthesizer 102. In examples, the 2*P input clocks are equally distributed in phase (e.g., 360/2P degrees in phase separation) and of nominal 50% duty cycle. In such case, the falling edges of the connected phases serve as the leading edges of the higher-order phases. This avoids routing and distribution of all 2*P phases at likely expense of increased phase uncertainty caused by usage of both edges. In a more general case, both edges of all 2P clock phases or arbitrary non-zero phase separation and duty cycle are used. FIG. 7A shows an example of the phase decrementer 202. FIG. 7B shows examples of the clock generator 204 and the clock phase selector 206. FIG. 7C shows an example of the phase generator and combiner 208.

The clock synthesizer 102 includes an XOR gate 703, an OR gate 705, an AND gate 706, an adder 702, an adder 704, a multiplexer 708, a compare-to-zero circuit 714, a subtract-by-two-to-power-M circuit 710, a register 712, a flip-flop 720, a binary-to-one-hot circuit 721, a register 724, a register 722, OR gates 728, AND gates 730, flip-flops 732, and an OR gate 734. Inputs of XOR gate 703 are coupled to receive a high_nlow signal and a count_div signal, each of which is a single-bit signal. Inputs of the OR gate 705 are coupled to receive an output of the XOR gate 703 and a signal "both," which is a single-bit signal. Inputs of the AND gate 706 are coupled to receive an output of the OR gate 705 and an X-bit half_offset signal, where X is an integer greater than zero. Inputs of the adder 702 are coupled to receive an (N+M)-bit signal half_per and the node 716. The node 716 is on an (N+M)-bit bus. The (N+M)-bit signal half_per includes M fractional bits in a fixed-point (N+M) bit binary value. Inputs of the adder 704 are coupled to an output of the AND gate 706 and an output of the adder 702. Inputs of the multiplexer 708 are coupled to an output of the adder 704 and the node 716. The XOR gate 703, the OR gate 705, the AND gate 706, and the adder 704 comprise a modulator 750 for modulating the counter reload value half_per. The modulator 750 is gated by the control signals count_div, high_n-low, and both.

An input of the subtract-by-two-to-power-M circuit 710 is coupled to an output of the multiplexer 708. As noted above, output of the multiplexer 708 is always decremented by decimal 1.0 regardless of the number of fractional bits M. In this general case, that means the output of the multiplexer 708 is decremented by binary 1 shifted by M places or $2^M$. An input of the register 712 is coupled to an output of the subtract-by-two-to-power-M circuit 710. A clock input of the register 712 is coupled to receive clk[0] of the multi-phase clock (clk). An output of the register 712 is coupled to the node 716. The output of the register 712 provides the signal count[M+N−1:M] (i.e., the integer portion) to an input of the compare-to-zero circuit 714. A control input of the multiplexer 708 is coupled to an output 718 of the compare-to-zero circuit 714, which provides a single-bit signal int_cnt_zero.

An input to the binary-to-one-hot circuit 721 is coupled to receive count[M−1:0] from the register 712 (i.e., the fractional portion). The signal count[M−1:0] is an implementation of frac_cnt from FIG. 2. An output of the binary-to-one-hot circuit 721 is coupled to an input of the register 724. Theregister 724 comprises 2P flip-flops each having a data input (D), an output (Q), an inverted output (Q_bar), and a clock input. Since the input of the binary-to-one-hot circuit 721 is M bits, and since $2^M=2P$, the output of the binary-to-one-hot circuit is of width 2P. An output of the register 724 is coupled to an input of the register 722. The register 722 comprises 2P flip-flops each having a data input (D), an output (Q), an inverted output (Q_bar), and a clock input. Inputs of the XOR gate 726 are coupled to receive the signal int_cnt_zero and an output of the flip-flop 720. An input of the flip-flop 720 is coupled to an output of the XOR gate 726. Clock inputs of the flip-flop 720, the register 722, and the register 724 are coupled to receive the signal clk[0]. The output of the flip-flop 720 provides the signal count_div. The flip-flop 720 and the XOR gate 726 comprise the clock generator 204. The binary-to-one-hot circuit 721, the register 724, and the register 722 comprise the clock phase selector 206.

The 2P-bit output bus of the register 722 has its signal lines coupled to inputs of the OR gates 728-0 through 728-2P−1, respectively. The 2P-bit output bus of the register 724 has its signal lines coupled to inputs of the OR gates 728-0 through 728-2P−1, respectively. First inputs of the AND gates 730-0 through 730-2P−1 are coupled to receive the count_div signal (a single-bit signal). Second inputs of the AND gates 730-0 through 730-2P−1 are coupled to outputs of the OR gates 728-0 through 728-2P−1, respectively. Inputs of the flip-flops 732-0 through 732-2P−1 are coupled to outputs of the AND gates 730-1 through 730-2P−1, respectively. Clock inputs of the flip-flops 732-0 through 732-2P−1 are coupled to receive multiple phase clock signals clk. Inputs of the OR gate 734 are coupled to outputs of the flip-flops 732. An output of the OR gate 734 provides the signal clk_ana. The flip-flops 732-0 through 732-(P−1) are rising-edge flops, and the flip-flops 732-P through 732-(2P−1) are falling-edge flops.

As described above, in this example, only P phases of the 2P-phase input clock are connected to the clock synthesizer and the falling edge of the connected phases double for the high-order phases. In other examples, all 2P phases can be distributed and only the rising edges used in the flip-flops 732.

The phase decrementer (FIG. 7A) is substantially the same as in the single-phase case. However, the number of fractional bits is increased to the base-2 log of the number of output phases, i.e., M=$\log_2(2*P)$. In this case, the rnd_bit input is expanded (and renamed to half_offset) to a bus of arbitrary width (e.g., X bits) with additional controls (both, high_nlow) to determine whether either or both high and low output clock periods are modulated by the positive offset in half_offset. Operation is otherwise identical, as is the toggle clock generator that follows.

The phase selection and phase generation logic differ and is now both expanded and regularized for all phases. The residual fractional count from the phase decrementer is one-hot encoded to select one of the output phases (phase_sel_nxt) and this is then re-timed in register 724 to align with the required output state, count_div, and then further delayed in register 722. The OR combination of the outputs of the registers 722 and 724 extends the high pulse width of the selected phase by one input clock cycle. This is required to guarantee phase overlap when switching from a later phase at the start of a high period to an earlier phase at the end of the same high period. One consequence of this is that the high period can never be shorter than a whole clk period.

Note that the clock phase connections to the flip-flops 732 are rotated relative to the phase selection. In effect, a residual phase of 0 selects clk[1] rising, 1 selects clk[2] rising, etc. This is done to minimize the latency from phase selection, on clk[0] rising, to the earliest output, while ensuring that clk_phase[0] is correctly updated before the remainder. As a further alternative, the rotation of the clock phase connections can be removed, but as a consequence the phase selection for clk_phase[0] must be derived one cycle earlier. This makes the input-side logic of flip-flop 732-0 a special case but has the advantage of a slightly lower latency as compared to the arrangement shown.

The clock synthesizer 102 can be deployed to provide clocks to analog circuits in a programmable device or application specific integrated circuit (ASIC). An example programmable device in which the clock synthesizer 102 can be deployed is described below.

Figure 10A:
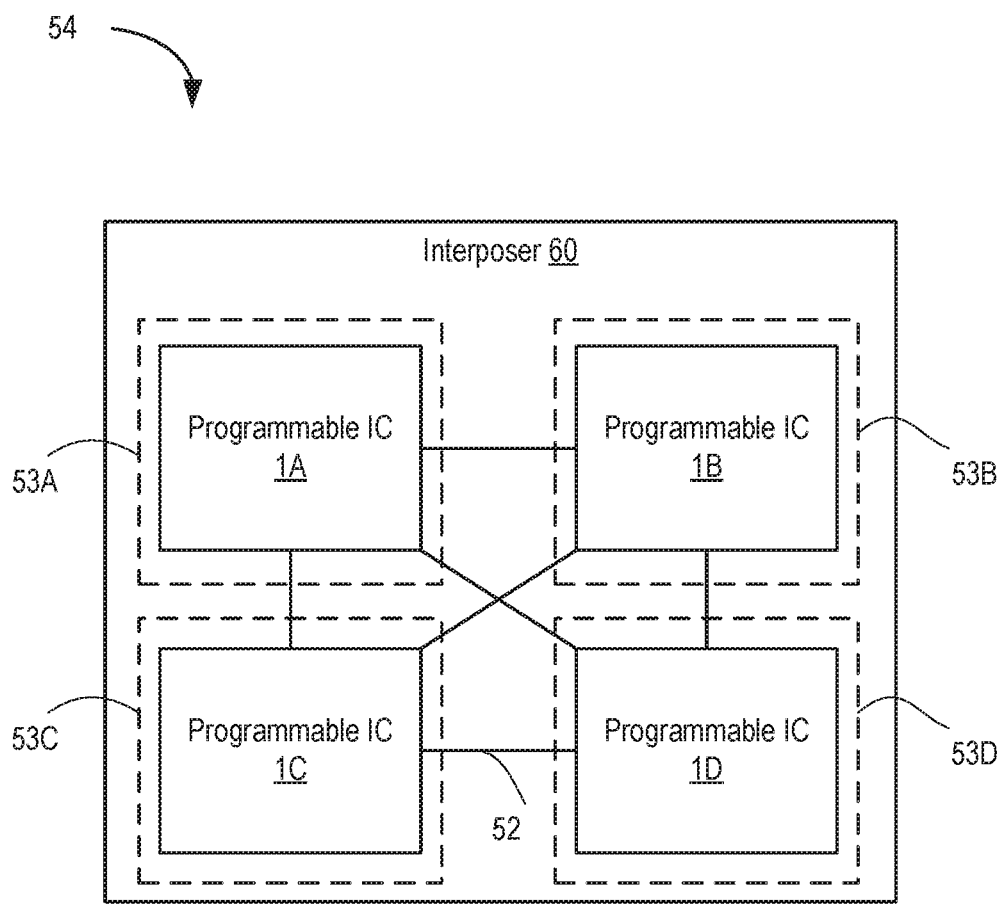
FIG. 10A is a block diagram depicting a programmable device according to an example.

FIG. 10A is a block diagram depicting a programmable device 54 according to an example. The programmable device 54 includes a plurality of programmable integrated circuits (ICs) 1, e.g., programmable ICs 1A, 1B, 1C, and 1D. In an example, each programmable IC 1 is an IC die disposed on an interposer 60. Each programmable IC 1 comprises a super logic region (SLR) 53 of the programmable device 54, e.g., SLRs 53A, 53B, 53C, and 53D. The programmable ICs 1 are interconnected through conductors on the interposer 60 (referred to as super long lines (SLLs) 52).

Figure 10B:
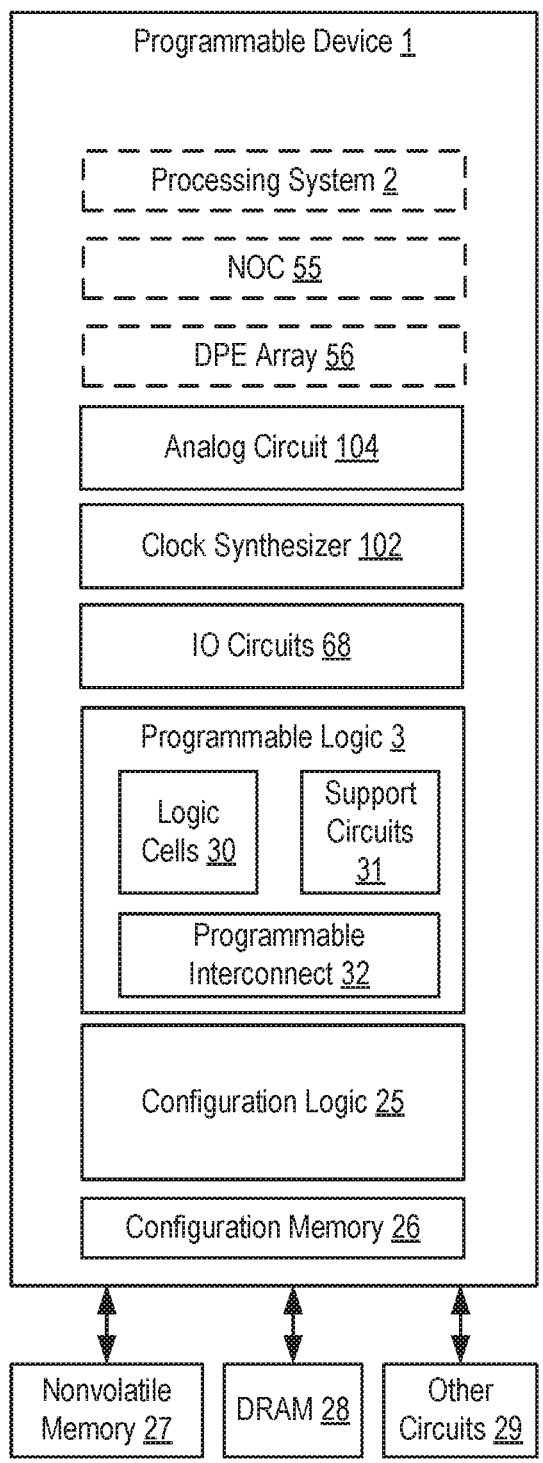
FIG. 10B is a block diagram depicting a programmable IC according to an example.

FIG. 10B is a block diagram depicting a programmable IC 1 according to an example. The programmable IC 1 can be used to implement one of the programmable ICs 1A-1D in the programmable device 54. The programmable IC 1 includes programmable logic (PL) 3 (also referred to as a programmable fabric), configuration logic 25, and configuration memory 26. The programmable IC 1 can be coupled to external circuits, such as nonvolatile memory 27, DRAM 28, and other circuits 29. The PL 3 includes logic cells 30, support circuits 31, and programmable interconnect 32. The logic cells 30 include circuits that can be configured to implement general logic functions of a plurality of inputs. The support circuits 31 include dedicated circuits, such as transceivers, input/output blocks, digital signal processors, memories, and the like. The logic cells and the support circuits 31 can be interconnected using the programmable interconnect 32. Information for programming the logic cells 30, for setting parameters of the support circuits 31, and for programming the programmable interconnect 32 is stored in the configuration memory 26 by the configuration logic 25. The configuration logic 25 can obtain the configuration data from the nonvolatile memory 27 or any other source (e.g., the DRAM 28 or from the other circuits 29). In some examples, the programmable IC 1 includes a processing system (PS) 2. The PS 2 can include microprocessor(s), memory, support circuits, IO circuits, and the like. In some examples, the programmable IC 1 includes a network-on-chip (NOC) 55 and data processing engine (DPE) array 56. The NOC 55 is configured to provide for communication between subsystems of the programmable IC 1, such as between the PS 2, the PL 3, and the DPE array 56. The DPE array 56 can include an array of DPE's configured to perform data processing, such as an array of vector processors. The programmable IC 1 can include a clock synthesizer 102 (or more than one) to provide a clock signal to an analog circuit 104 (or multiple analog circuits), such as an ADC.

Figure 10C:
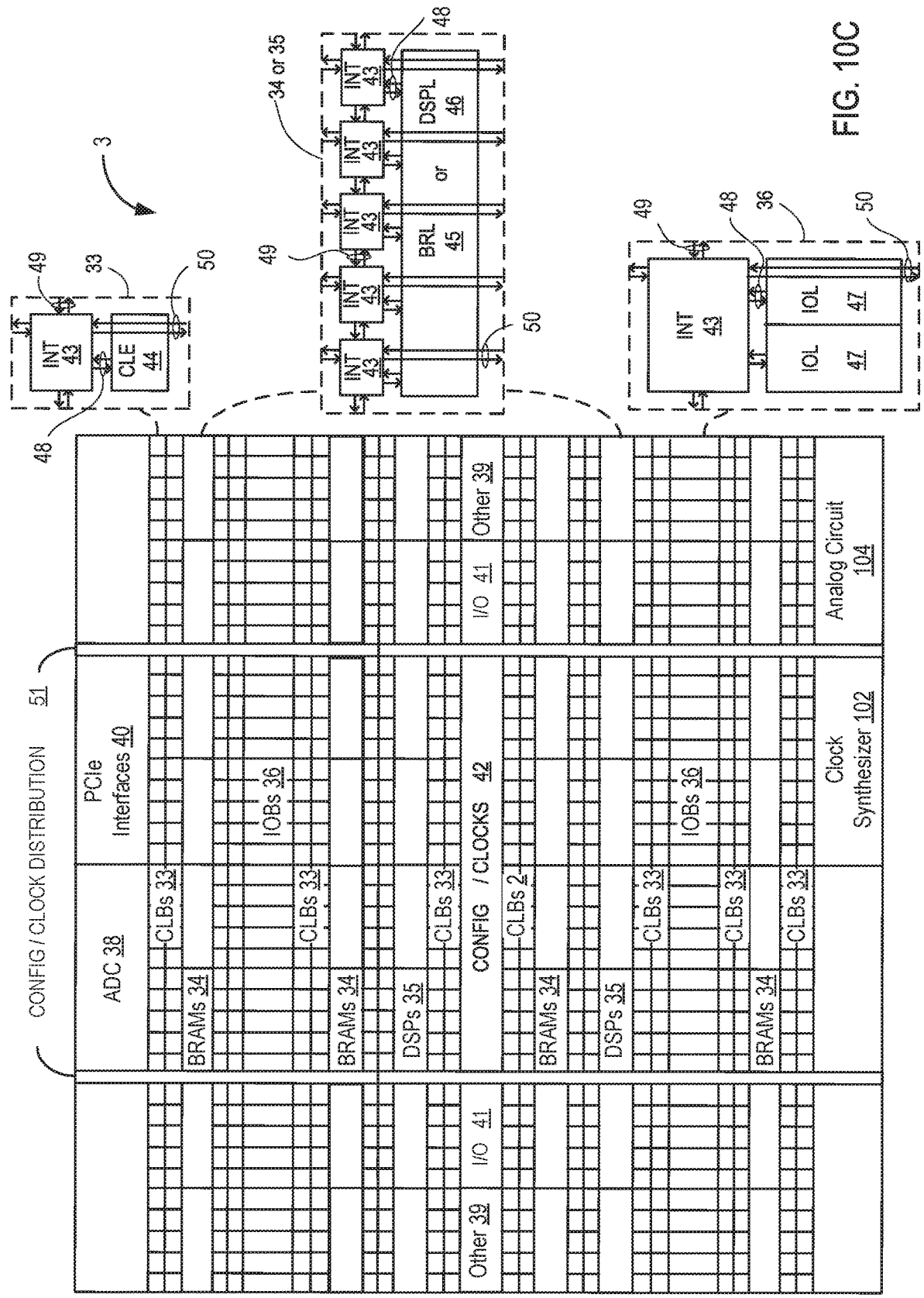
FIG. 10C illustrates a field programmable gate array (FPGA) implementation of the programmable IC according to an example.

FIG. 10C illustrates a field programmable gate array (FPGA) implementation of the programmable IC 1 that includes the PL 3. The PL 3 shown in FIG. 10C can be used in any example of the programmable devices described herein. The PL 3 includes a large number of different programmable tiles including configurable logic blocks ("CLBs") 33, random access memory blocks ("BRAMs") 34, input/output blocks ("IOBs") 36, configuration and clocking logic ("CONFIG/CLOCKS") 42, digital signal processing blocks ("DSPs") 35, specialized input/output blocks ("I/O") 41 (e.g., configuration ports and clock ports), and other programmable logic 39 such as digital clock managers, analog-to-digital converters, system monitoring logic, and so forth. The PL 3 can also include PCIe interfaces 40, analog-to-digital converters (ADC) 38, and the like. In examples, the programmable IC 1 can include a clock synthesizer 102 providing a clock to an analog circuit 104.

In some PLs, each programmable tile can include at least one programmable interconnect element ("INT") 43 having connections to input and output terminals 48 of a programmable logic element within the same tile, as shown by examples included at the top of FIG. 10C. Each programmable interconnect element 43 can also include connections to interconnect segments 49 of adjacent programmable interconnect element(s) in the same tile or other tile(s). Each programmable interconnect element 43 can also include connections to interconnect segments 50 of general routing resources between logic blocks (not shown). The general routing resources can include routing channels between logic blocks (not shown) comprising tracks of interconnect segments (e.g., interconnect segments 50) and switch blocks (not shown) for connecting interconnect segments. The interconnect segments of the general routing resources (e.g., interconnect segments 50) can span one or more logic blocks. The programmable interconnect elements 43 taken together with the general routing resources implement a programmable interconnect structure ("programmable interconnect") for the illustrated PL.

In an example implementation, a CLB 33 can include a configurable logic element ("CLE") 44 that can be programmed to implement user logic plus a single programmable interconnect element ("INT") 43. A BRAM 34 can include a BRAM logic element ("BRL") 45 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 35 can include a DSP logic element ("DSPL") 46 in addition to an appropriate number of programmable interconnect elements. An IOB 36 can include, for example, two instances of an input/output logic element ("IOL") 47 in addition to one instance of the programmable interconnect element 43. As will be clear to those of skill in the art, the actual I/O pads connected, for example, to the I/O logic element 47 typically are not confined to the area of the input/output logic element 47.

In the pictured example, a horizontal area near the center of the die (shown in FIG. 3D) is used for configuration, clock, and other control logic. Vertical columns 51 extending from this horizontal area or column are used to distribute the clocks and configuration signals across the breadth of the PL.

Some PLs utilizing the architecture illustrated in FIG. 10C include additional logic blocks that disrupt the regular columnar structure making up a large part of the PL. The additional logic blocks can be programmable blocks and/or dedicated logic.

Note that FIG. 10C is intended to illustrate only an exemplary PL architecture. For example, the numbers of logic blocks in a row, the relative width of the rows, the number and order of rows, the types of logic blocks included in the rows, the relative sizes of the logic blocks, and the interconnect/logic implementations included at the top of FIG. 9C are purely exemplary. For example, in an actual PL more than one adjacent row of CLBs is typically included wherever the CLBs appear, to facilitate the efficient implementation of user logic, but the number of adjacent CLB rows varies with the overall size of the PL.

While the foregoing is directed to specific examples, other and further examples may be devised without departing from the basic scope thereof, and the scope thereof is determined by the claims that follow.

What is claimed is:

1. A clock synthesizer having a single-phase clock signal as input and generating an output clock, the clock synthesizer comprising:
    a phase decrementer having a first input and a second input, the second input configured to receive a fractional period value, the phase decrementer configured to, responsive to the fractional period value, maintain a fractional count and configured to accumulate residual phase from cycle-to-cycle of the output clock;
    a clock generator having an input coupled to a first output of the phase decrementer and an output coupled to the first input of the phase decrementer, the first output of the phase decrementer providing an integer-count-zero signal indicative of an integer portion of the fractional count reaching zero;
    a clock phase selector having an input coupled to a second output of the phase decrementer, the second output of the phase decrementer providing a signal having a fractional portion of the fractional count; and
    a phase generator and combiner coupled to an output of the clock generator and an output of the clock phase selector, the phase generator and combiner configured to provide the output clock.

2. The clock synthesizer of claim 1, wherein the phase decrementer comprises:
    a register configured to store the fractional count;
    a decrement-by-two circuit coupled to an input of the register;
    a multiplexer having an output coupled to an input of the decrement-by-two circuit;
    a modulator coupled to a first input of the multiplexer;
    a first adder coupled to an input of the modulator, the first adder configured to add the fractional period value and an output of the register; and
    a compare-to-zero circuit having an output, providing the integer-count-zero signal, coupled to a control input of the multiplexer, the compare-to-zero circuit configured to compare the integer portion of the fractional count in the register to zero; and
    wherein the modulator is configured to modulate output of the first adder.

3. The clock synthesizer of claim 2, wherein the clock generator comprises:
    a first flip-flop; and
    an exclusive OR gate, an output of the exclusive OR gate coupled to an input of the first flip-flop, a first input of the exclusive OR gate coupled to an output of the compare-to-zero circuit, and a second input of the exclusive OR gate coupled to an output of the first flip-flop.

4. The clock synthesizer of claim 3, wherein the modulator further comprises:
    a second adder coupled to the first input of the multiplexer; and
    an AND gate having an output coupled to the second adder, a first input coupled to receive a random bit signal, and a second input, which is logically inverted, coupled to the output of the first flip-flop.

5. The clock synthesizer of claim 4, further comprising:
    a randomizer having an output coupled to the first input of the AND gate to supply the random bit signal.

6. The clock synthesizer of claim 3, wherein the clock phase selector comprises:
    a first falling-edge flip-flop having an input coupled to an output of the register; and
    a first OR gate having a first input coupled to an output of the first falling-edge flip-flop and a second input coupled to the input of the first falling-edge flip-flop.

7. The clock synthesizer of claim 6, wherein the phase generator and combiner comprises:
    a first AND gate having a first input coupled to the output of the exclusive OR gate and a second input, which is logically inverted, coupled to the output of the register;
    a second AND gate having a first input coupled to the output of the first flip-flop and a second input coupled to the output of the first OR gate;

a second flip-flop having an input coupled to an output of the first AND gate;
a second falling-edge flip-flop having an input coupled to an output of the second AND gate; and
a second OR gate having inputs coupled to respective outputs of the second flip-flop and the second falling-edge flip-flop.

8. A clock synthesizer having a multi-phase clock signal as input and generating an output clock, the multi-phase clock signal including P clock phases, where P is an integer greater than one, the clock synthesizer comprising:
a phase decrementer having a first input and a second input, the second input configured to receive a fractional period value, the phase decrementer configured to, responsive to the fractional period value, maintain a fractional count and configured to accumulate residual phase from cycle-to-cycle of the output clock;
a clock generator having an input coupled to a first output of the phase decrementer and an output coupled to the first input of the phase decrementer, the first output of the phase decrementer providing an integer-count-zero signal indicative of an integer portion of the fractional count reaching zero;
a clock phase selector having an input coupled to a second output of the phase decrementer, the second output of the phase decrementer providing a signal having a fractional portion of the fractional count, the fractional portion of the fractional count having M bits, where $M=\log_2(2*P)$; and
a phase generator and combiner coupled to an output of the clock generator, and a pair of outputs of the clock phase selector, the phase generator and combiner configured to provide the output clock.

9. The clock synthesizer of claim 8, wherein the phase decrementer comprises:
a first register configured to store the fractional count;
a subtract-by-two-to-power-M circuit coupled to an input of the first register;
a multiplexer having an output coupled to an input of the subtract-by-two-to-power-M circuit;
a modulator coupled to a first input of the multiplexer;
a first adder coupled to an input of the modulator, the first adder configured to add the fractional period value and an output of the first register; and
a compare-to-zero circuit having an output, providing the integer-count-zero signal, coupled to a control input of the multiplexer, the compare-to-zero circuit configured to compare the integer portion of the fractional count in the first register to zero; and
wherein the modulator is configured to modulate output of the first adder.

10. The clock synthesizer of claim 9, wherein the clock generator comprises:
a first flip-flop; and
a first exclusive OR gate, an output of the first exclusive OR gate coupled to an input of the first flip-flop, a first input of the first exclusive OR gate coupled to an output of the compare-to-zero circuit, and a second input of the first exclusive OR gate coupled to an output of the first flip-flop.

11. The clock synthesizer of claim 10, wherein the modulator further comprises:
a second adder coupled to the first input of the multiplexer;
an AND gate having an output coupled to the second adder, a first input to receive an offset signal, and a second input;
an OR gate having an output coupled to the second input of the AND gate, a first input to receive a first control signal, and a second input; and
a second exclusive OR gate having an output coupled to the second input of the OR gate, a first input to receive a second control signal, and a second input coupled to the output of the first flip-flop.

12. The clock synthesizer of claim 10, wherein the clock phase selector comprises:
a binary-to-one-hot circuit having an input coupled to the output of the first register to receive the fractional portion of the fractional count;
a second register having an input coupled to an output of the binary-to-one-hot circuit; and
a third register having an input coupled to an output of the second register.

13. The clock synthesizer of claim 12, wherein the phase generator and combiner comprises:
first OR gates coupled to the outputs of the second register and the third register;
AND gates having first inputs coupled to respective outputs of the first OR gates, and second inputs each coupled to the output of the first flip-flop;
second flip-flops having inputs coupled to outputs of a first plurality of the AND gates;
falling-edge flip-flops having inputs coupled to outputs of a second plurality of the AND gates; and
a second OR gate having inputs coupled to outputs of the second flip-flops and the falling-edge flip-flops.

14. The clock synthesizer of claim 13, wherein the outputs of the second register and the third register each comprise 2*P bits, wherein the first OR gates comprise 2*P OR gates, and wherein the AND gates comprise 2*P AND gates.

15. A circuit, comprising:
an analog circuit; and
a clock synthesizer, coupled to the analog circuit to provide an output clock, the clock synthesizer comprising:
a phase decrementer having a first input and a second input, the second input configured to receive a fractional period value, the phase decrementer configured to, responsive to the fractional period value, maintain a fractional count and configured to accumulate residual phase from cycle-to-cycle of the output clock;
a clock generator having an input coupled to a first output of the phase decrementer and an output coupled to the first input of the phase decrementer, the first output of the phase decrementer providing an integer-count-zero signal indicative of an integer portion of the fractional count reaching zero;
a clock phase selector having an input coupled to a second output of the phase decrementer, the second output of the phase decrementer providing a signal having a fractional portion of the fractional count; and
a phase generator and combiner coupled to an output of the clock generator, and at least one output of the clock phase selector, the phase generator and combiner configured to provide the output clock.

16. The circuit of claim 15, wherein the phase decrementer comprises:
a register configured to store the fractional count;
a decrement-by-two circuit coupled to an input of the register;
a multiplexer having an output coupled to an input of the decrement-by-two circuit;

a modulator coupled to a first input of the multiplexer;

a first adder coupled to an input of the modulator, the first adder configured to add the fractional period value and an output of the register; and a compare-to-zero circuit having an output, providing the integer-count-zero signal, coupled to a control input of the multiplexer, the compare-to-zero circuit configured to compare the integer portion of the fractional count in the register to zero; and wherein the modulator is configured to modulate output of the first adder.

17. The circuit of claim 16, wherein the clock generator comprises:

a first flip-flop; and an exclusive OR gate, an output of the exclusive OR gate coupled to an input of the first flip-flop, a first input of the exclusive OR gate coupled to an output of the compare-to-zero circuit, and a second input of the exclusive OR gate coupled to an output of the first flip-flop.

18. The circuit of claim 17, wherein the modulator comprises:

a second adder coupled to the first input of the multiplexer; and an AND gate having an output coupled to the second adder, a first input coupled to receive a random bit signal, and a second input, which is logically inverted, coupled to the output of the first flip-flop.

19. The circuit of claim 17, wherein the clock phase selector comprises:

a first falling-edge flip-flop having an input coupled to an output of the register; and a first OR gate having a first input coupled to an output of the first falling-edge flip-flop and a second input coupled to the input of the first falling-edge flip-flop.

20. The circuit of claim 19, wherein the phase generator and combiner comprises:

a first AND gate having a first input coupled to the output of the exclusive OR gate and a second input, which is logically inverted, coupled to the output of the register;

a second AND gate having a first input coupled to the output of the first flip-flop and a second input coupled to the output of the first OR gate;

a second flip-flop having an input coupled to an output of the first AND gate;

a second falling-edge flip-flop having an input coupled to an output of the second AND gate; and a second OR gate having inputs coupled to respective outputs of the second flip-flop and the second falling-edge flip-flop.

\* \* \* \* \*